(12) United States Patent
Fang et al.

(10) Patent No.: US 11,791,127 B2
(45) Date of Patent: *Oct. 17, 2023

(54) SYSTEM AND METHOD FOR BARE WAFER INSPECTION

(71) Applicant: ASML Netherlands B.V., Veldhoven (NL)

(72) Inventors: Wei Fang, Milpitas, CA (US); Joe Wang, Campbell, CA (US)

(73) Assignee: ASML Netherlands B.V., Veldhoven (NL)

( * ) Notice: Subject to any disclaimer, the term of this patent is extended or adjusted under 35 U.S.C. 154(b) by 138 days.

This patent is subject to a terminal disclaimer.

(21) Appl. No.: 17/397,863

(22) Filed: Aug. 9, 2021

(65) Prior Publication Data

US 2022/0068592 A1 Mar. 3, 2022

Related U.S. Application Data

(63) Continuation of application No. 16/517,390, filed on Jul. 19, 2019, now Pat. No. 11,087,954.

(Continued)

(51) Int. Cl.
*H01J 37/22* (2006.01)
*G01N 21/95* (2006.01)
(Continued)

(52) U.S. Cl.
CPC ........ *H01J 37/222* (2013.01); *G01N 21/8851* (2013.01); *G01N 21/9501* (2013.01);
(Continued)

(58) Field of Classification Search
CPC ...... H01J 37/222; H01J 37/14; H01J 37/1471; H01J 37/226; H01J 37/244; H01J 37/28;
(Continued)

(56) References Cited

U.S. PATENT DOCUMENTS 6,407,373 B1 6/2002 Dotan
6,476,388 B1 11/2002 Nakagaki et al.
(Continued)

FOREIGN PATENT DOCUMENTS

JP 2008 135568 A 6/2008
JP 2011 038798 A 2/2011
(Continued)

OTHER PUBLICATIONS

International Search Report dated Sep. 13, 2019 for corresponding PCT International Application No. PCT/EP2019/069173 (4 pages).

(Continued)

*Primary Examiner* — Kiet T Nguyen
(74) *Attorney, Agent, or Firm* — Finnega, Henderson, Farabow, Garrett & Dunner, LLP

(57) ABSTRACT

A wafer inspection system includes a controller in communication with an electron-beam inspection tool. The controller includes circuitry to: acquire, via an optical imaging tool, coordinates of defects on a sample; set a Field of View (FoV) of the electron-beam inspection tool to a first size to locate a subset of the defects; determine a position of each defect of the subset of the defects based on inspection data generated by the electron-beam inspection tool during a scanning of the sample; adjust the coordinates of the defects based on the determined positions of the subset of the defects; and set the FoV of the electron-beam inspection tool to a second size to locate additional defects based on the adjusted coordinates.

20 Claims, 5 Drawing Sheets

Related U.S. Application Data

(60) Provisional application No. 62/701,466, filed on Jul. 20, 2018.

(51) Int. Cl.
| | | |
|---|---|---|
| *G01N 21/956* | (2006.01) | |
| *H01J 37/14* | (2006.01) | |
| *H01J 37/147* | (2006.01) | |
| *H01J 37/244* | (2006.01) | |
| *H01J 37/28* | (2006.01) | |
| *G01N 21/88* | (2006.01) | |
| *H01J 37/153* | (2006.01) | |

(52) U.S. Cl.
CPC ............ *G01N 21/956* (2013.01); *H01J 37/14* (2013.01); *H01J 37/1471* (2013.01); *H01J 37/226* (2013.01); *H01J 37/244* (2013.01); *H01J 37/28* (2013.01); *H01J 2237/20292* (2013.01); *H01J 2237/24592* (2013.01); *H01J 2237/2804* (2013.01)

(58) Field of Classification Search
CPC ........... H01J 37/153; H01J 2237/20292; H01J 2237/24592; H01J 2237/2804; G01N 21/9501; G01N 21/956; G01N 21/8851; G01N 23/2251; H01L 21/682; H01L 22/12; H01L 22/20
USPC ......................................... 250/306, 307, 310
See application file for complete search history.

(56) References Cited

U.S. PATENT DOCUMENTS

| | | | |
|---|---|---|---|
| 7,825,386 | B2 | 11/2010 | Liu et al. |
| 7,960,697 | B2 | 6/2011 | Chen et al. |
| 8,045,145 | B1 | 10/2011 | Bakker et al. |
| 8,094,924 | B2 | 1/2012 | Jau et al. |
| 8,164,060 | B2 | 4/2012 | Liu et al. |
| 2004/0126909 | A1 | 7/2004 | Obara et al. |
| 2006/0104500 | A1 | 5/2006 | Obara et al. |
| 2007/0085006 | A1 | 4/2007 | Motoki |
| 2008/0270044 | A1 | 10/2008 | Hirai et al. |
| 2010/0092070 | A1 | 4/2010 | Young et al. |
| 2011/0261190 | A1 | 10/2011 | Nakagaki et al. |
| 2011/0280469 | A1 | 11/2011 | Lee |
| 2012/0327212 | A1 | 12/2012 | Kitahashi et al. |
| 2013/0037716 | A1 | 2/2013 | Tadaka et al. |
| 2013/0277553 | A1 | 10/2013 | Otani et al. |
| 2014/0219546 | A1 | 8/2014 | Minekawa et al. |
| 2015/0062571 | A1 | 3/2015 | Kulkarni et al. |
| 2015/0248991 | A1* | 9/2015 | Ogawa ............... G01B 9/02021 250/491.1 |
| 2016/0217968 | A1 | 7/2016 | Li et al. |
| 2017/0249753 | A1 | 8/2017 | Otani et al. |

FOREIGN PATENT DOCUMENTS

| | | |
|---|---|---|
| TW | 201035536 A | 10/2010 |
| TW | 201342420 A | 10/2013 |
| TW | 201543524 A | 11/2015 |

OTHER PUBLICATIONS

Taiwanese Office Action issued in related Taiwanese Patent Application No. 108125365, dated May 26, 2020 (14 pgs.).
Office Action of the Intellectual Property Office of Taiwan issued in related Taiwanese Patent Application No. 110105335; dated Apr. 22, 2022 (6 pgs.).

* cited by examiner

SYSTEM AND METHOD FOR BARE WAFER INSPECTION

CROSS-REFERENCE TO RELATED APPLICATIONS

This application is a continuation of Application No. 16/517,390, filed Jul. 19, 2019, which claims priority of US application 62/701,466 which was filed on Jul. 20, 2018, and both of which are is incorporated herein by reference in their entireties its entireties.

TECHNICAL FIELD

The present disclosure generally relates to the field of semiconductor wafer metrology, and more particularly, to a system and method for dynamically inspecting a bare or un-patterned wafer using a charged-particle (e.g., electron) scanning tool.

BACKGROUND

In manufacturing processes of integrated circuits (ICs), unfinished or finished circuit components need to be inspected to ensure that they are manufactured according to design and are free of defects. Moreover, before being used to fabricate the ICs, a bare or un-patterned wafer also needs to be inspected to ensure it is free of defects or meets the required specifications. As such, a bare-wafer inspection process has been integrated into the manufacturing process.

Large defects on a bare wafer are visible with optical microscopy. However, as wafer processing conditions become increasingly stringent, the sizes of defects of interest are below the diffraction limit of optical microscopy. For example, as technology nodes are reduced down to 10 nm, optical tools may generate a large amount of nuisance defects (i.e., false positives). In some optical inspection systems, 90% of identified defects may turn out to be nuisance defects. Therefore, it is important to review the identified defects and confirm whether they are real defects.

SUMMARY

Embodiments of the present disclosure relate to systems and methods for inspecting a bare wafer. In some embodiments, a defect review tool is provided. The tool includes a controller in communication with an electron-beam inspection tool. The controller includes circuitry to: acquire, via an optical imaging tool, coordinates of defects on a sample; set a Field of View (FoV) of the electron-beam inspection tool to a first size to locate a subset of the defects; determine a position of each defect of the subset of the defects based on inspection data generated by the electron-beam inspection tool during a scanning of the sample; adjust the coordinates of the defects based on the determined positions of the subset of the defects; and set the FoV of the electron-beam inspection tool to a second size to locate additional defects based on the adjusted coordinates.

In some embodiments, a wafer inspection system is provided. The system includes an optical imaging tool configured to illuminate a sample with a laser beam and detect light scattered from the sample. The system also includes an electron-beam inspection tool configured to scan the sample with a primary electron beam to generate inspection data. The system further includes a controller in communication with the optical imaging tool and the electron-beam inspection tool. The controller includes circuitry to: receive light-scattering data generated by the optical imaging tool; determine coordinates of defects on the sample based on the light-scattering data; set a Field of View (FoV) of the electron-beam inspection tool to a first size to locate a subset of the defects; determine a position of each defect of the subset of the defects based on inspection data generated by the electron-beam inspection tool during a scanning of the sample; adjust the coordinates of the defects based on the determined positions of the subset of the defects; and set the FoV of the electron-beam inspection tool to a second size to locate additional defects based on the adjusted coordinates.

In some embodiments, a controller is provided. The controller is coupled with an electron-beam inspection tool which scans a sample with a primary electron beam to generate inspection data. The controller includes a memory storing instructions. The controller also includes a processor configured to execute the instructions to cause the controller to: acquire, via an optical imaging tool, coordinates of defects on the sample; set a Field of View (FoV) of the electron-beam inspection tool to a first size to locate a subset of the defects; determine a position of each defect of the subset of the defects based on inspection data generated by the electron-beam inspection tool during a scanning of the sample; adjust the coordinates of the defects based on the determined positions of the subset of the defects; and set the FoV of the electron-beam inspection tool to a second size to locate additional defects based on the adjusted coordinates.

In some embodiments, a computer-implemented wafer inspection method is provided. The method includes acquiring, via an optical imaging tool, coordinates of defects on a sample. The method also includes setting a Field of View (FoV) of an electron-beam inspection tool to a first size to locate a subset of the defects. The method also includes determining a position of each defect of the subset of the defects based on inspection data generated by the electron-beam inspection tool during a scanning of the sample. The method also includes adjusting the coordinates of the defects based on the determined positions of the subset of the defects. The method further includes setting the FoV of the electron-beam inspection tool to a second size to locate additional defects based on the adjusted coordinates.

In some embodiments, a non-transitory computer-readable medium is provided. The medium stores a set of instructions that are executable by a processor of a devices to cause the device to perform a method including: acquiring, via an optical imaging tool, coordinates of defects on a sample; setting a Field of View (FoV) of an electron-beam inspection tool to a first size to locate a subset of the defects; determining a position of each of the subset of the defects based on inspection data generated by the electron-beam inspection tool during a scanning of the sample; adjusting the coordinates of the defects based on the determined positions of the subset of the defects; and setting the FoV of the electron-beam inspection tool to a second size to locate additional defects based on the adjusted coordinates.

Additional objects and advantages of the disclosed embodiments will be set forth in part in the following description, and in part will be apparent from the description, or may be learned by practice of the embodiments. The objects and advantages of the disclosed embodiments may be realized and attained by the elements and combinations set forth in the claims.

It is to be understood that both the foregoing general description and the following detailed description are exemplary and explanatory only and are not restrictive of the disclosed embodiments, as claimed.

DESCRIPTION OF THE EMBODIMENTS

Figure 1:
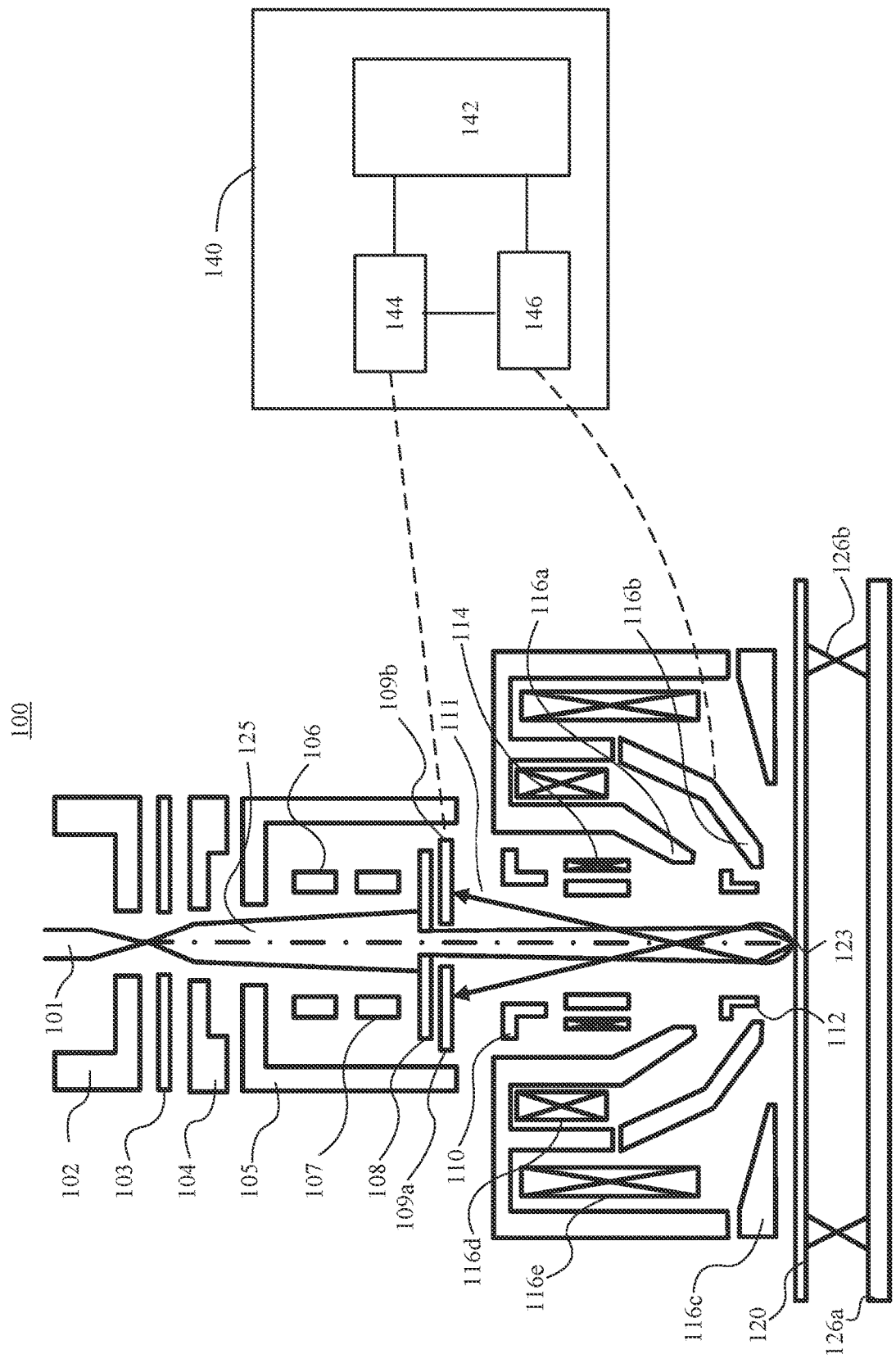
FIG. 1 is a schematic diagram illustrating an exemplary electron-beam inspection tool for inspecting a wafer, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims Before being used for IC fabrication, a bare wafer (or "un-patterned" wafer, "blank" wafer) needs to be inspected to ensure it is free of defects. For example, the bare wafer needs to be inspected for contamination (e.g., particles, metal contaminants) and surface quality (e.g., pits, scratches, crystal defects), which may adversely affect the wafer yield (i.e., how many good-quality circuit units can be made from a wafer) or performance of the manufactured circuits (e.g., short circuit, bad contact, etc., that can impair the proper functioning of a circuit). Moreover, the result of the bare-wafer inspection is a good indication of the cleanliness of the fabrication or metrology equipment. If the bare wafer has a high defect density, the fabrication or metrology equipment needs to be cleaned before the fabrication process is started.

Currently, bare-wafer inspection is often performed by optical microscopy. However, as described above, as the semiconductor industry is striving to make smaller circuits, the size of the defects that can impact the circuit manufacturing and functioning, and thus need to be detected, is also becoming smaller (e.g., down to the order of 10 nm, which is below the typical optical wavelength). Therefore, the inspection result reported by the optical microscopy may contain a large number of inaccuracies, e.g., false positives.

Charged-particle (e.g., electron) beam microscopes, such as a scanning electron microscope (SEM), may be used to review the defects identified by an optical microscope, because when compared to a photon beam, an electron beam has a shorter wavelength and thereby may offer superior spatial resolution. In practice, a bare wafer may be first placed under an optical microscope to identify potential defect locations. The bare wafer is then transferred to a SEM, and the potential defect locations may be further examined by the SEM to determine whether they correspond to real defects. Therefore, it is needed for the optical microscope to communicate the locations of the potential defects to the SEM, or for the SEM to "know" the locations of the potential defects as identified by the optical microscope.

Because the bare wafer is devoid of patterns, the locations of defects cannot be indicated by referring to the wafer itself but rather have to be expressed in terms of mathematical coordinates on the images generated by the optical microscope and the SEM. However, because the alignments of the wafer on the optical microscope and the SEM are not identical, the same defect may have different coordinates on the optical image and the SEM image (hereinafter referred to as "optical map coordinates" and "electron map coordinates," respectively). That is, in the SEM's field of view (FoV), the defect may not be exactly at its optical map coordinates. Therefore, to locate the defect, the SEM has to search in the vicinity of the defect's optical map coordinates until the defect is found. This is time consuming, particularly because the scanning speed of the SEM is low.

The present disclosure provides a system and method for improving the throughput for inspecting a bare wafer. The bare wafer can be first imaged by an optical imaging tool to identify potential defects, and then scanned by a SEM to verify whether the potential defects are real defects. The SEM performs the bare-wafer inspection in two phases—(1) a calibration phase and (2) a review phase. In the calibration phase, the SEM calibrates the difference between the defects' optical map coordinates and electron map coordinates. Specifically, a subset of the potential defects is selected. For each of the selected potential defects, the SEM searches in a vicinity of the location corresponding to the defect's optical map coordinates, using a FoV that is large enough to cover the wafer alignment error. This way, if the location corresponding to a potential defect's optical map coordinates falls in the SEM's field of view, the potential defect itself also falls in the SEM's field of view, such that the SEM can find the potential defect and determine the defect's electron map coordinates by just scanning the current field of view (i.e., in a single image). After the SEM locates all selected potential defects and determines their electron map coordinates, a transformation relationship (e.g., a transformation matrix) between the optical imaging tool's coordinate system and the SEM's coordinate system is determined based on the selected potential defects' optical map coordinates and electron map coordinates.

After the transformation relationship is determined, the SEM locates and reviews the remaining potential defects in the review phase, using a smaller FoV. Specifically, the remaining potential defects' electron map coordinates may be determined based on their optical map coordinates and the transformation relationship. The SEM then searches for the remaining potential defects in vicinities surrounding their determined electron map coordinates. The errors between the determined electron map coordinates and the remaining potential defects' true locations in the SEM's field of view are usually small enough to be covered by the smaller FoV. This way, despite the reduced FoV size, as long as the location corresponding to a potential defect's determined electron map coordinates falls in the SEM's field of view, the SEM can find the potential defect by just scanning the current field of view (i.e., in a single image).

As described above, the disclosed method controls the SEM to use a large FoV in the calibration phase, while using a small FoV in the review phase. In the calibration phase, the large FoV enables the SEM to locate a potential defect in a current field of view, without the need of searching in multiple images. Therefore, despite the transformation relationship between the optical map coordinates and electron map coordinates being unknown, the amount of time used in searching for the potential defects can be reduced. In the review phase, using the transformation relationship developed during the calibration phase, it takes less time to scan for the identified defects using the small FoV, thereby further speeding up the defect-locating process. It can be seen that by dynamically switching the SEM from the large FoV to the small FoV, the disclosed method enables the SEM to quickly and accurately locate potential defects. Accordingly, the system throughput for inspecting the bare wafer is drastically improved.

As used throughout this disclosure, unless specifically stated otherwise, the term "or" encompasses all possible combinations, except where infeasible. For example, if it is stated that a device can include A or B, then, unless specifically stated otherwise or infeasible, the device can include A, or B, or A and B. As a second example, if it is stated that a device can include A, B, or C, then, unless specifically stated otherwise or infeasible, the device can include A, or B, or C, or A and B, or A and C, or B and C, or A and B and C.

FIG. 1 is a schematic diagram illustrating an exemplary electron beam (e-beam) tool 100, consistent with the disclosed embodiments. As shown in FIG. 1, a primary electron beam 125 is emitted from a cathode 101 by applying a voltage between an anode 102 and cathode 101. Primary electron beam 125 passes through a gun aperture 103 and a beam limit aperture 104, both of which can determine the current of electron beam entering a condenser lens 105, which resides below beam limit aperture 104. Condenser lens 105 focuses primary electron beam 125 before the beam enters an objective aperture 108 to set the current of the electron beam before entering a compound objective lens 116. In some embodiments, e-beam tool 100 may also include an astigmatism corrector 106 or a beam blanker module 107, for adjusting the beam profile of primary electron beam 125.

Compound objective lens 116 is configured to form a magnetic field and an electrostatic field for focusing primary electron beam 125 onto a wafer 120 and forming a probe spot 123 on a surface of wafer 120. Compound objective lens 116 may include an upper pole piece 116a, a shared pole piece 116b, and a lower pole piece 116c. Upper pole piece 116a and shared pole piece 116b constitute a conical magnetic lens, which has an excitation coil 116d. Shared pole piece 116b and lower pole piece 116c constitute an immersion magnetic lens, which has an excitation coil 116e. The conical magnetic lens and the immersion magnetic lens share the same shared pole piece 116b.

When electric currents are applied onto excitation coils 116d and 116e, respectively, an axially-symmetric magnetic field is generated onto the wafer surface area. A part of wafer 120 being scanned by primary electron beam 125 can be immersed in the magnetic field. Different voltages are applied onto wafer 120, upper pole piece 116a, and shared pole piece 116b, to generate an axial symmetric retarding electric field near the wafer surface. The electric field reduces the energy of impinging primary electron beam 125 near the surface of the wafer before it collides with wafer 120. Shared pole piece 116b controls an axially-symmetric electric field on the wafer to prevent micro-arcing of the wafer and to ensure proper beam focus at the wafer surface with the axially-symmetric magnetic field together.

E-beam tool 100 also includes an X-Y stage 126a and a Z stage 126b for moving wafer 120 to the axial area of primary electron beam 125 and adjusting the height of wafer 120 to the focused-imaging plane of primary electron beam 125.

A pre-lens deflector 110 (e.g., a deflector upstream of the compound objective lens) and an in-lens deflector 112 (e.g., a deflector in the compound objective lens) deflect primary electron beam 125 to scan probe spot 123 over wafer 120. For example, in a scanning process, deflectors 110, 112 can be controlled to deflect primary electron beam 125 sequentially onto different locations of top surface of wafer 120 at different time points, to provide data for image reconstruction for different parts of wafer 120. Moreover, deflectors 110, 112 can also be controlled to deflect primary electron beam 125 onto different sides of wafer 120 at a particular location, at different time points, to provide data for stereo image reconstruction of the wafer structure at that location. Further, in some embodiments, anode 102 and cathode 101 can be configured to generate multiple primary electron beams 125, and e-beam tool 100 can include multiple sets of deflectors 110, 112 to project the multiple primary electron beams 125 to different parts/sides of wafer 120 at the same time.

A secondary electron beam 111 can be emitted from the part of wafer 120 upon receiving primary electron beam 125. A cross-electromagnetic (E×B) alignment unit 114 aligns the optical axis of secondary electron beam 111 with the optical axis of primary electron beam 125. Secondary electron beam 111 can be received by sensor surfaces 109a and 109b of an electron detector 109. Electron detector 109 can generate a signal (e.g., a voltage, a current, etc.) that represents an intensity of secondary electron beam 111, and provide the signal to a processing system (not shown in FIG. 1). The intensity of secondary electron beam 111 can vary according to the external or internal structure of wafer 120. Moreover, as discussed above, primary electron beam 125 can be projected onto different locations of the top surface of wafer 120, or different sides of wafer 120 at a particular location, to generate secondary electron beams 111 of different intensities. Therefore, by mapping the intensity of secondary electron beam 111 with the locations of wafer 120, the processing system can reconstruct an image that reflects the internal or external structures of wafer 120.

Consistent with the disclosed embodiments, a FoV and resolution of e-beam tool 100 can be adjusted by changing the structural configuration or controlling the operation of compound objective lens 116. Specifically, the magnetic field and the electrostatic field formed by compound objective lens 116 can be controlled to change the landing energy of primary electron beam 125 or the size of scan probe spot 123.

For example, the distance from the bottom surface of shared pole piece 116b to the wafer surface 120 can be a distance within the range from 1.0 to 8.0 mm. The bore size of shared pole piece 116b can be a dimension within the range from 1.0 to 30.0 mm. These two dimensions can be used to provide the appropriate electrostatic and magnetic field strength at the wafer surface and an appropriate probe size. To achieve a large FoV (and thus a relatively low resolution), a relatively long distance between shared pole piece 116b to the wafer surface 120 and larger bore size are preferred. Under this configuration, the conical magnetic lens, formed by upper pole piece 116a and shared pole piece 116b, works as the primary focusing objective lens. Therefore, high landing energy beam and a large scanning FoV (and low resolution) are achievable. In contrast, to achieve a small FoV (and thus a relatively high resolution), a shorter distance between the shared pole piece 116b to the wafer surface 120 and small bore size are used. Under this configuration, the immersion magnetic lens, formed by shared pole piece 116b and lower pole piece 116c, works as the primary focusing objective lens. Therefore, a low landing energy beam and a small scanning FoV (and high resolution) are achievable.

Additionally or alternatively, the landing energy of primary electron beam 125 or the size of scan probe spot 123 can also be adjusted by controlling the strength of the conical magnetic lens or the immersion magnetic lens. As described above, different voltages may be applied onto wafer 120, upper pole piece 116a, and shared pole piece 116b, to adjust the strength of the electric field near wafer 120. When the electric field generated by the conical magnetic lens (i.e., upper pole piece 116a and shared pole piece 116b) is stronger, the conical magnetic lens works as the primary focusing objective lens, thereby achieving the large scanning FoV and low resolution. When the electric field generated by the immersion magnetic lens (i.e., shared pole piece 116b and wafer 120) is stronger, the immersion magnetic lens works as the primary focusing objective lens, thereby achieving the smaller scanning FoV and higher resolution. In the disclosed embodiments, in order to apply various voltages onto shared pole piece 116b, shared pole piece 116b is electrically insulated from upper pole piece 116a.

Although FIG. 1 shows e-beam tool 100 as a single-beam inspection tool, it is contemplated that e-beam tool 100 may also be a multi-beam inspection tool that uses multiple primary electron beams. As describe above, e-beam tool 100 may be configured to generate multiple primary electron beams 125 for simultaneously probing multiple areas of wafer 120. Correspondingly, e-beam tool 100 may also include multiples sets of compound objective lens 116 (i.e., multiple sets of conical magnetic lens and immersion magnetic lens) for focusing the multiple primary electron beams 125, respectively. The multiple sets of compound objective lens 116 may be controlled collectively or individually to adjust FoV sizes of the multiple primary electron beams 125 collectively or individually. As it will be evident from the following description, the principles disclosed in the present disclosure can be applied in both single-beam and multi-beam inspection tools.

Consistent with the disclosed embodiments, e-beam tool 100 also includes a controller 140 that includes a memory 142, an image acquirer 144, and a processor 146. Processor 146 may include a computer, server, mainframe host, terminals, personal computer, any kind of mobile computing devices, a microprocessor-based system, a microcontroller, an embedded system (e.g., firmware), or any other suitable control circuit or system. Processor 146 may be specially configured with hardware or software modules for controlling the operation of e-beam tool 100. For example, processor 146 may change the voltage applied to shared pole piece 116b, so as to adjust the FoV size of e-beam tool 100.

Image acquirer 144 may be a computer system similar to processor 146. Image acquirer 144 may connect with detector 109 through a medium such as an electrical conductor, optical fiber cable, portable storage media, IR, Bluetooth, internet, wireless network, wireless radio, or a combination thereof. Image acquirer 144 may receive a signal from detector 109 and may construct an image of wafer 120. Image acquirer 144 may also perform various post-processing functions, such as generating contours, superimposing indicators on an acquired image, and the like. Image acquirer 144 may be configured to perform adjustments of brightness and contrast, etc. of acquired images.

Memory 142 may be a storage medium such as a random access memory (RAM), a hard disk, cloud storage, other types of computer readable memory, and the like. Memory 142 may be coupled with image acquirer 144 and processor 146. Memory 142 stores computer instructions or programs that are accessible and executable by image acquirer 144 and processor 146 for performing functions consistent with the present disclosure. Memory 142 may also be used for saving scanned raw image data as original images and post-processed images.

Figure 2:
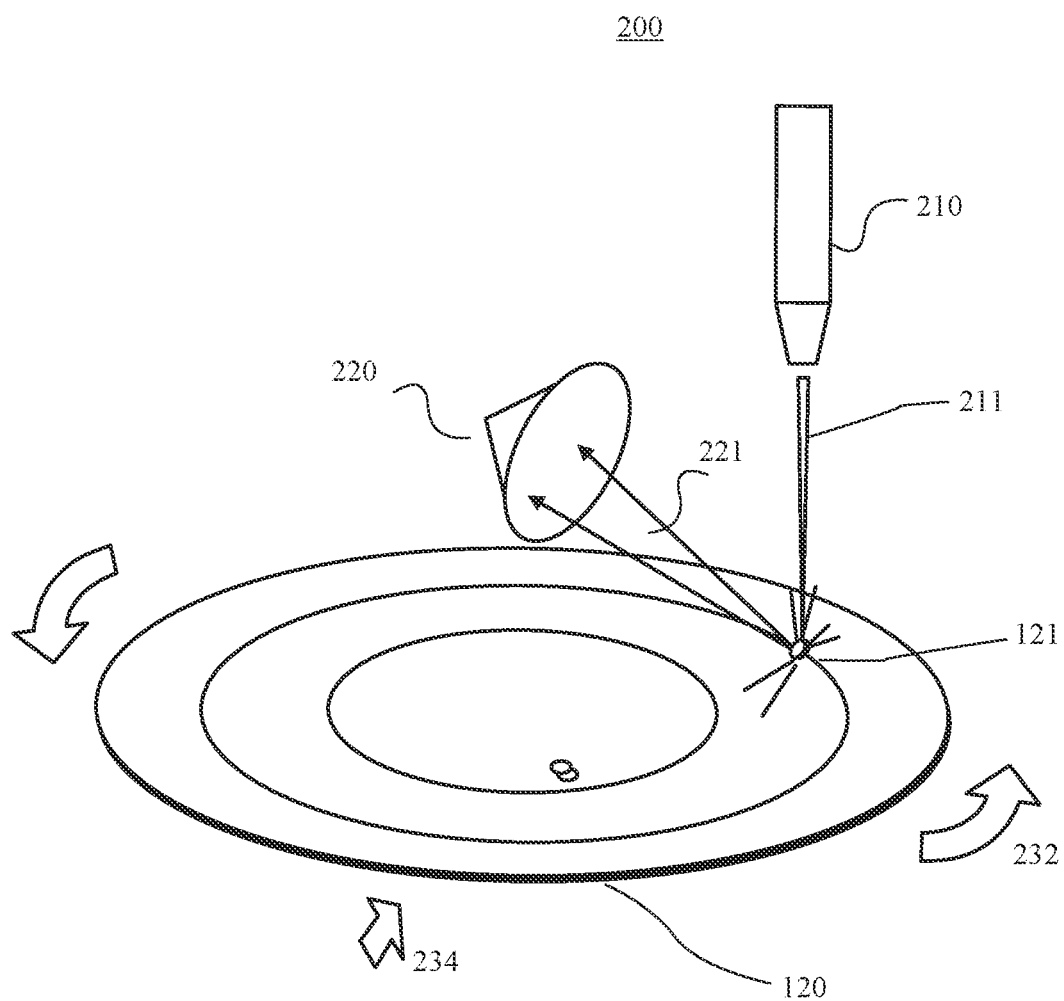
FIG. 2 is a schematic diagram illustrating an exemplary optical imaging tool for inspecting a wafer, consistent with embodiments of the present disclosure.

As described above, optical microscopy can be used to detect potential defect locations on a bare wafer. FIG. 2 is a schematic diagram illustrating an exemplary optical imaging tool 200 for inspecting a wafer, consistent with embodiments of the present disclosure. Referring to FIG. 2, optical imaging tool 200 includes a laser 210 for projecting an incident laser beam 211 to a wafer 120. The laser light will be scattered by wafer 120 and the scattered light 221 is detected by a light detector 220. When incident laser beam 211 hits a defect 121 on wafer 120, the intensity of scattered light 221 will change. Thus, by analyzing the intensity change of scattered light 221, potential defects can be detected.

Optical imaging tool 200 may also include a sample stage (not shown) configured to rotate wafer 120 along the tangential direction 232 and move wafer 120 in the radial direction 234. This way, incident laser beam 211 can irradiate the entire surface of wafer 120 to detect the potential defects. Based on the wafer rotation angle and the radius position of the laser beam, the position coordinates of the particle/defect are calculated and registered.

Figure 3:
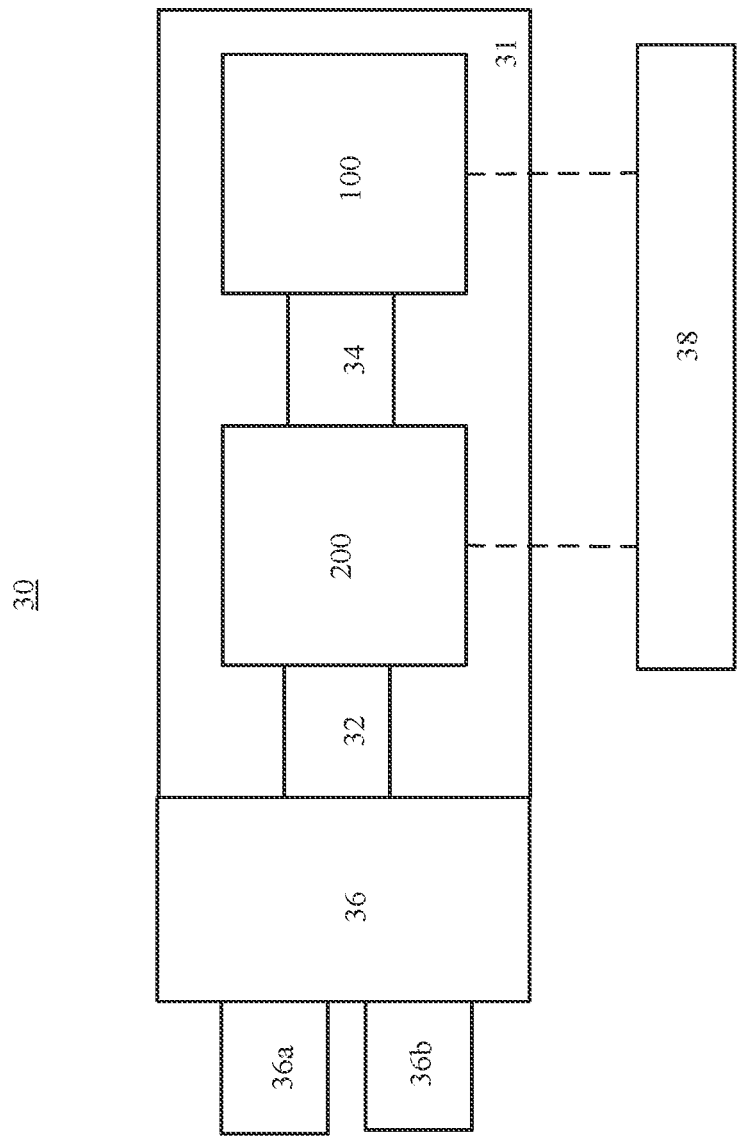
FIG. 3 is a block diagram of a defect inspection tool for inspecting a bare wafer, consistent with embodiments of the present disclosure.

FIG. 3 is a schematic diagram illustrating an exemplary electron-beam inspection (EBI) system 30 for detecting detects on a bare wafer, consistent with embodiments of the present disclosure. As shown in FIG. 3, EBI system 30 includes a main chamber 31, a load/lock chamber 32, an optical imaging tool 200, an e-beam tool 100, and an equipment front end module (EFEM) 36. Optical imaging tool 200 and e-beam tool 100 are located within main chamber 31 and are connected by a sample-transferring chamber 34.

EFEM 36 includes a first loading port 36a and a second loading port 36b. EFEM 36 may include additional loading port(s). First loading port 36a and second loading port 36b can receive wafer front opening unified pods (FOUPs) that contain bare wafers (e.g., semiconductor wafers or wafers made of other material(s)). One or more robot arms (not shown) in EFEM 36 may transport the bare wafers to load/lock chamber 32. For example, the robot arms may include an actuator for driving a belt to transport the bare wafers to load/lock chamber 32. The robot arms may also include circuitry configured to send control signals to the actuator.

Load/lock chamber 32 is connected to a load/lock vacuum pump system (not shown), which removes gas molecules in load/lock chamber 32 to reach a first pressure below the atmospheric pressure. After reaching the first pressure, one or more robot arms (not shown) may transport the bare wafer from load/lock chamber 32 to main chamber 31. Main chamber 31 is connected to a main chamber vacuum pump system (not shown), which removes gas molecules in main chamber 31 to reach a second pressure below the first pressure. After reaching the second pressure, the bare wafer is subject to inspection by optical imaging tool 200 to detect potential defect locations. After optical imaging tool 200 finishes scanning the bare wafer, one or more robot arms (not shown) in sample-transferring chamber 34 may transport the bare wafer to e-beam tool 100 for verifying whether the potential defects are real defects. E-beam tool 100 may be a single-beam tool or a multi-beam tool.

EBI system 30 may also include a computer system, e.g., controller 38, configured to execute various controls of EBI system 30. Consistent with the disclosed embodiments, controller 38 may be electronically connected to e-beam tool 100 or optical imaging tool 200. For example, controller 38 may include circuitry and memory (e.g., such as the circuitry and memory of controller 140 of FIG. 1) configured to control e-beam tool 100 or optical imaging tool 200 to scan a bare wafer, receive image data from e-beam tool 100 or optical imaging tool 200, and analyze the image data to inspect defects on the bare wafer. As another example, controller 38 may also include circuitry configured to control e-beam tool 100 to switch between different FoV sizes while scanning the bare wafer. While controller 38 is shown in as being outside of the structure that include main chamber 31, load/lock chamber 32, and EFEM 36, it is appreciated that controller 38 can be integrated inside the structure.

Figure 4:
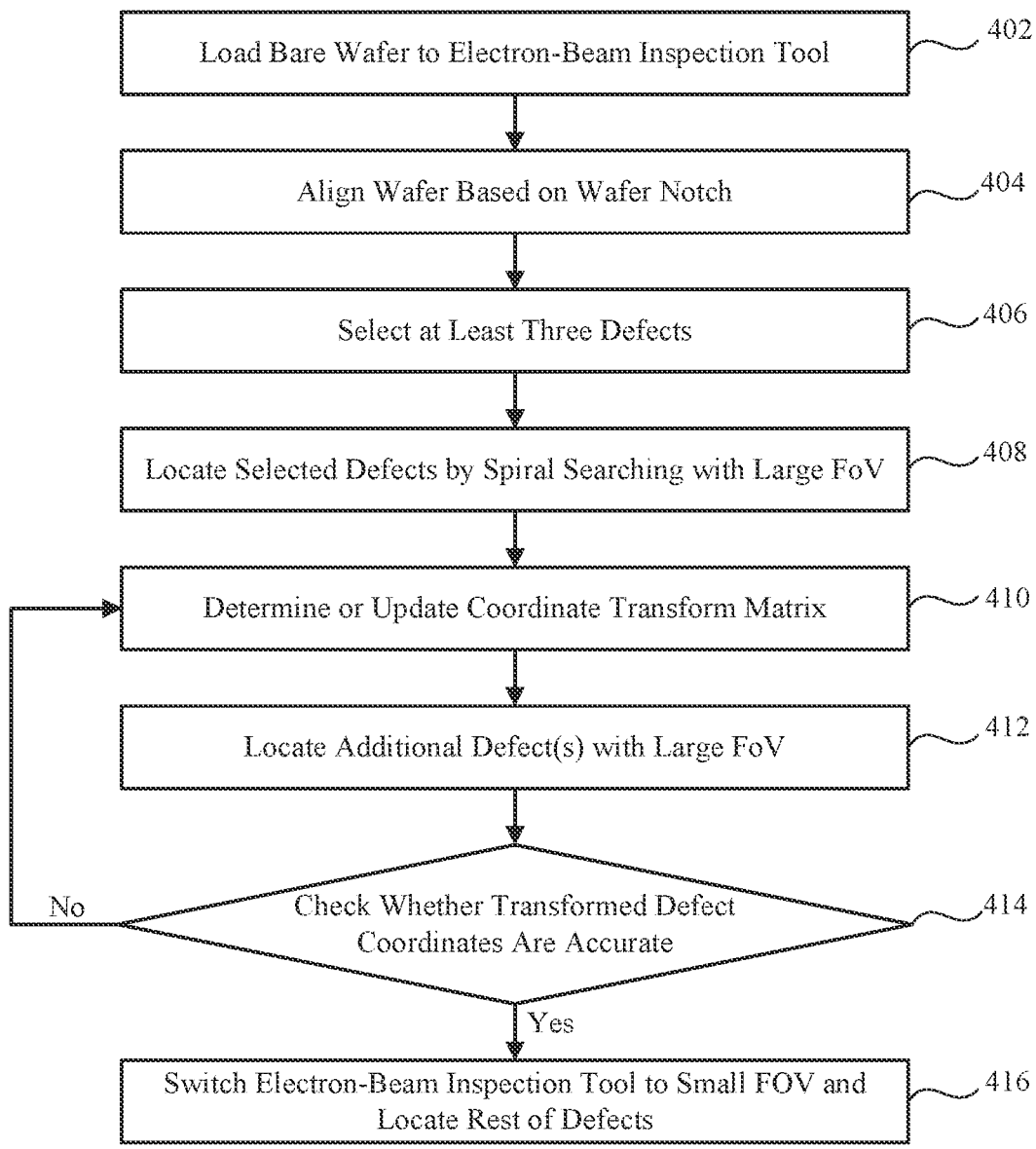
FIG. 4 is a flowchart of a method for bare wafer inspection, consistent with embodiments of the present disclosure.

FIG. 4 is a flowchart of a method 40 for bare wafer inspection, consistent with embodiments of the present disclosure. For example, method 40 may be performed by EBI system 30. Referring to FIG. 4, method 40 may include the following steps 402-416.

In step 402, a bare wafer (e.g., wafer 120) is loaded to an e-beam tool (e.g., e-beam tool 100). In some embodiments, before being inspected by the e-beam tool, the bare wafer is first inspected by an optical imaging tool (e.g., optical imaging tool 200) to detect potential defect locations. As described above, because of the low resolution of the optical imaging tool, the potential defects may include false positives and may need to be examined by the e-beam tool. Thus, after being inspected by the optical imaging tool, the bare wafer is transferred to and loaded on a sample stage (e.g., stage 126) of the e-beam tool.

In step 404, the e-beam tool aligns the bare wafer according to a notch on the bare wafer. As described above, the bare wafer has no printed patterns that can serve as reference marks for determine its orientation. In some embodiments, the bare wafer's edge may be provided with a notch (e.g., notch 122 in FIG. 5) to mark its direction. Both the optical imaging tool and e-beam tool may align the bare wafer based on the notch. This way, the wafer alignment error can be limited.

In step 406, the e-beam tool (e.g., controller 140) selects at least two potential defects identified by the optical image tool. Consistent with the disclosed embodiments, the e-beam tool may randomly select the at least two potential defects and obtain their optical map coordinates (i.e., coordinates in the optical imaging tool's coordinate system).

In step 408, the e-beam tool locates the selected potential defects by spiral searching the selected defects with a large scanning FoV. In the disclosed embodiments, although the wafer may be aligned on the optical imaging tool and e-beam tool based on the wafer notch, this is only rough alignment and there may be large errors. Moreover, the sample stages and mounting structures used in the optical imaging tool and e-beam tool are not identical. Therefore, the optical imaging tool and e-beam tool may have different coordinate systems (i.e., the same defect on the bare wafer has different optical map coordinates and electron map coordinates). Thus, a transformation relationship between these two coordinate systems needs to be calibrated. In addition, this transformation relationship will change every time when the bare wafer is remounted on the optical imaging tool or e-beam tool, or when a different bare wafer is inspected. Therefore, the calibration may be constantly performed.

Because a potential defect's optical map coordinates do not indicate its true location in the e-beam tool's field of view, the e-beam tool may search the potential defect in a vicinity of the optical map coordinates, until the potential defect is found. As described in connection with FIG. 1, the e-beam tool may operate in large and small FoVs. To locate the selected potential defects, the e-beam tool may be switched to a FoV that is large enough to cover the wafer alignment errors, but with a pixel size that is sensitive to detecting the defects. By controlling the sample stage to move the bare wafer in its radial and tangential directions, the e-beam tool may perform a spiral searching of the selected potential defects using the large FoV. In some embodiments, search patterns other than spiral searching are utilized to search for the selected potential defects. The search patterns can be any search pattern that may enable the selected potential defects to be located.

Referring back to FIG. 4, in step 410, after locating the selected potential defects, the e-beam tool determines the selected potential defects' electron map coordinates in the e-beam tool's field of view. Based on the selected potential defects' optical map coordinates and electron map coordinates, a transformation matrix may be determined.

In step 412, the e-beam tool locates additional potential defects based on the transformation matrix. Specifically, the transformation matrix is applied to the additional potential defects' optical map coordinates to obtain transformed coordinates. After that, the e-beam tool may search for the additional potential defects in vicinities of the transformed coordinates, using the large FoV.

In step 414, the accuracy of the transformed defect coordinates are checked. Consistent with the disclosed embodiments, if the transformation matrix is accurate, the transformed coordinates should be close to the additional potential defects' true positions in the e-beam tool's field of view (e.g., the additional potential defects' electron map coordinates). In some embodiments, differences (e.g., distances) between the transformed coordinates and the corresponding defects' true positions are compared. If the differences exceed a predetermined threshold, this indicates that the transformation matrix is not accurate and may need to be updated. Thus, method 40 may return to step 410, at which the transformation matrix is updated based on the additional potential defects' optical map coordinates and electron map coordinates. Consistent with the disclosed embodiments, steps 410-414 may be reiterated until the transformation matrix is determined to be accurate.

In step 416, after the transformation matrix is determined to be accurate, the e-beam tool may switch to a small FoV and locate the remaining potential defects based on their transformed coordinates. Specifically, the transformation matrix may be applied to the remaining potentials defects' optical map coordinates to obtain transformed coordinates. The e-beam tool then searches for the remaining potential defects in vicinities of their transformed coordinates, using the small FoV. Because the transformation matrix is accurate, the error between the transformed coordinates and the corresponding defects' true electron map coordinates is small and can be covered by the small FoV. Moreover, because the small FoV has a high resolution, the e-beam tool can accurately determine whether the potential defects are real defects.

Figure 5:
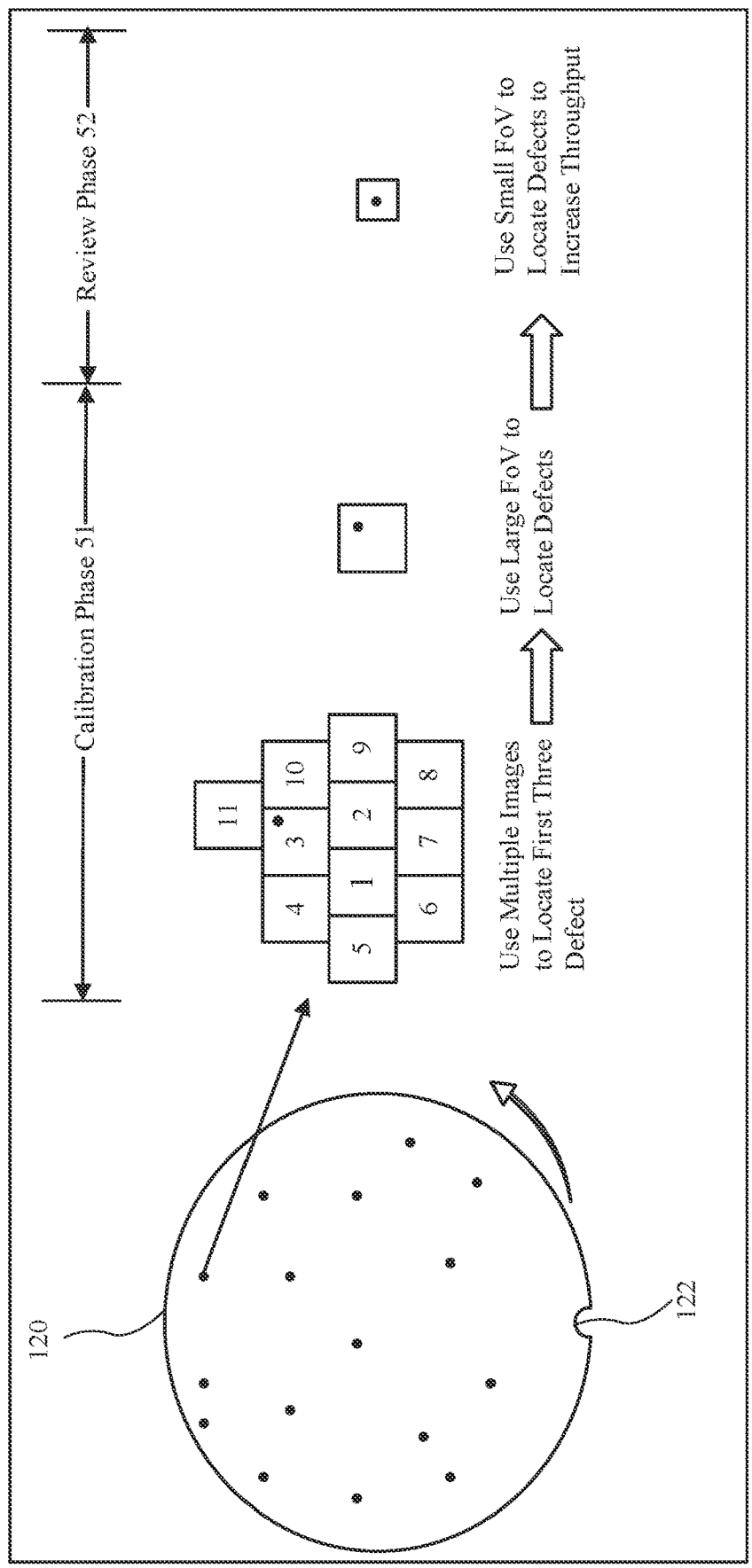
FIG. 5 is a schematic diagram illustrating an implementation of the method of FIG. 4, consistent with embodiments of the present disclosure.

By dynamically switching the e-beam tool from the large FoV to the small FoV, the system throughput for inspecting the bare wafer is improved. FIG. 5 is a schematic diagram illustrating an implementation of the method 40, consistent with some embodiments of the present disclosure. As shown in FIG. 5, in calibration phase 51, the wafer alignment error is calibrated based on differences between the optical map coordinates and electron map coordinates of a set of selected potential defects. Specifically, the e-beam tool first performs a spiral searching of the selected potential defects on the bare wafer, using a large FoV. The e-beam tool may generate multiple images during the spiral searching. Since the large FoV is enough to cover the wafer alignment error, a selected potential defect and the position corresponding to the defect's optical map coordinates may be covered by the same image. Therefore, the e-beam tool can locate a selected potential defect by just examining a single image that includes the position corresponding to defect's optical map coordinates, thereby avoiding the need of searching for the defect across multiple images. This way, the selected potential defects can be quickly located and used to determine a transformation relationship between the optical imaging tool's coordinate system and the e-beam tool's coordinate system.

After the calibration is completed, the e-beam tool may inspect the remaining potential defects on the bare wafer in review phase 52, using a small FoV. Specifically, the calibrated transformation relationship may be used to estimate the remaining potential defects' electron map coordinates based on their optical map coordinates. The SEM may search for the remaining potential defects in vicinities of their estimated coordinates. The small FoV is enough to cover the errors between the estimated coordinates and the remaining potential defects' true positions. Because it takes less time to scan a small FoV, the speed for locating and inspecting the remaining potential defects is increased. Accordingly, by dynamically switching the e-beam tool from the large FoV to the small FoV for the calibration phase and review phase, respectively, the system throughput is improved.

Consistent with the disclosed embodiments, in both the large and small FoVs, the resolution of the e-beam tool and the uniformity of its image focus are configured to be high enough for detecting the defects. This way, the disclosed method can quickly and accurately inspecting defects on a bare wafer.

It is appreciated that a controller of EBI system 30 could use software to control some functionality described above. For example, the controller could generate instructions for controlling the e-beam tool to switch between the large and small FoVs. As another example, the controller may receive image data from the e-beam tool 100 to optical imaging tool 200, and identify and locate defects from the images. For example another example, controller may compute the transformation matrix for the coordinate systems of the e-beam tool and optical imaging tool. The software could be stored on a non-transitory computer readable medium. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

The embodiments may further be described using the following clauses:

1. A defect review tool comprising:
   a controller in communication with an electron-beam inspection tool, the controller having circuitry to:
   acquire, via an optical imaging tool, coordinates of defects on a sample;
   set a Field of View (FoV) of the electron-beam inspection tool to a first size to locate a subset of the defects;
   determine a position of each defect of the subset of the defects based on inspection data generated by the electron-beam inspection tool during a scan of the sample;
   adjust the coordinates of the defects based on the determined positions of the subset of the defects; and
   set the FoV of the electron-beam inspection tool to a second size to locate additional defects based on the adjusted coordinates.
2. The defect review tool of clause 1, wherein the first size is larger than the second size.
3. The defect review tool of any one of clauses 1 and 2, wherein the sample is an un-patterned wafer.
4. The defect review tool of any one of clauses 1-3, wherein the controller having circuitry to adjust the coordinates of the defects based on the determined positions of the subset of the defects includes the controller having circuitry to:
   determine a transformation relationship for the coordinates of the detects based on the determined positions of the subset of the defects;
   map the coordinates acquired via the optical imaging tool to a new set of coordinates, based on the transformation relationship; and
   set the new set of coordinates as the adjusted coordinates.
5. The defect review tool of any one of clauses 1-3, wherein the controller having circuitry to adjust the coordinates of the defects based on the determined positions of the subset of the defects includes the controller having circuitry to:
   select a number of defects;
   control the electron-beam inspection tool to locate the selected detects;
   determine positions of the selected defects based on the inspection data;
   determine a transformation relationship for the coordinates of the detects based on the determined positions of the selected defects; and
   adjust the coordinates of the defects based on the transformation relationship.
6. The defect review tool of clause 5, wherein the controller has circuitry to select at least two defects as the subset of the defects.
7. The defect review tool of clause 5, wherein the controller having circuitry to set the FoV of the electron-beam inspection tool to the second size includes the controller having circuitry to:
   control the electron-beam inspection tool to locate a first defect, the first defect being different from the selected defects;
   determine a position of the first defect based on the inspection data;
   determine a difference between the determined position of the first defect and an adjusted coordinate of the first defect; and
   when the difference is equal to or below a predetermined threshold, change the FoV of the electron-beam inspection tool to the second size to locate additional defects based on the adjusted coordinates.

8. The defect review tool of clause 7, wherein the controller has circuitry to:
   when the difference exceeds the predetermined threshold, update the transformation relationship based on the determined position of the first defect; and
   further adjust the coordinates of the defects based on the updated transformation relationship.

9. The defect review tool of any one of clauses 1-8, wherein the optical imaging tool is a laser-scattering defect inspection tool having circuitry to illuminate the sample with a laser beam and to detect light scattered from the sample.

10. The defect review tool of clause 9, wherein the controller has circuitry to:
    receive light-scattering data from the optical imaging tool; and
    determine the coordinates of the defects based on the light-scattering data.

11. The defect review tool of any one of clauses 1-10, wherein the electron-inspection tool comprises:
    an electron source configured to generate a primary electron beam;
    at least one condenser lens for condensing the primary electron beam;
    a compound objective lens for focusing the primary electron beam to the sample on a stage system, the compound objective lens comprising:
      a first magnetic lens;
      a second magnetic lens, wherein a shared pole piece is configured for both the first magnetic lens and the second magnetic lens; and
      an electrostatic lens; and
    a detection system for detecting charged particles or X-ray emanated from the sample.

12. The defect review tool of clause 11, wherein the first magnetic lens comprises an upper pole piece and a first excitation coil.

13. The defect review tool of clause 12, wherein the second magnetic lens comprises a lower pole piece and a second excitation coil.

14. The defect review tool of clause 13, wherein the shared pole piece is isolated from the upper pole piece.

15. The defect review tool of clause 14, wherein the shared pole piece is isolated from the lower pole piece.

16. The defect review tool of clause 15, wherein the electrostatic lens comprises the upper pole piece, the shared pole piece, and the sample.

17. The defect review tool of clause 16, wherein the first magnetic lens is conical.

18. The defect review tool of clause 17, wherein the second magnetic lens is an immersion lens.

19. The defect review tool of clause 13, wherein the lower pole piece is isolated from the second magnetic lens.

20. The defect review tool of clause 15, wherein the lower pole piece is isolated from the second magnetic lens.

21. The defect review tool of clause 11, wherein the shared pole piece is electrically isolated from the first magnetic lens and the second magnetic lens.

22. A system comprising:
    an optical imaging tool including circuitry to illuminate a sample with a laser beam and detect light scattered from the sample;
    an electron-beam inspection tool including circuitry to scan the sample with a primary electron beam to generate inspection data; and
    a controller in communication with the optical imaging tool and the electron-beam inspection tool, the controller including circuitry to:
      receive light-scattering data generated by the optical imaging tool;
      determine coordinates of defects on the sample based on the light-scattering data;
      set a Field of View (FoV) of the electron-beam inspection tool to a first size to locate a subset of the defects;
      determine a position of each defect of the subset of the defects based on inspection data generated by the electron-beam inspection tool during a scan of the sample;
      adjust the coordinates of the defects based on the determined positions of the subset of the defects; and
      set the FoV of the electron-beam inspection tool to a second size to locate additional defects based on the adjusted coordinates.

23. The system of clause 22, wherein the electron-beam inspection tool including circuitry to scan the sample with the primary electron beam includes the electron-beam inspection tool including circuitry to scan the sample with multiple electron beams.

24. The system of any one of clauses 22 and 23, further comprising:
    a transport device including circuitry and an actuator to transport the sample from the optical imaging tool to the electron-beam inspection tool.

25. The system of any one of clauses 22-24, wherein the first size is larger than the second size.

26. The system of any one of clauses 22-25, wherein the sample is an un-patterned wafer.

27. The defect review tool of any one of clauses 22-26, wherein the controller including circuitry to adjust the coordinates of the defects based on the determined positions of the subset of the defects includes the controller including circuitry to:
    determine a transformation relationship for the coordinates of the detects based on the determined positions of the subset of the defects;
    map the coordinates acquired via the optical imaging tool to a new set of coordinates, based on the transformation relationship; and
    set the new set of coordinates as the adjusted coordinates.

28. The system of any one of clauses 22-26, wherein the controller including circuitry to adjust the coordinates of the defects based on the determined positions of the subset of the defects includes the controller including circuitry to:
    select a number of defects;
    control the electron-beam inspection tool to locate the selected detects;
    determine positions of the selected defects based on the inspection data;
    determine a transformation relationship for the coordinates of the detects based on the determined positions of the selected defects; and
    adjust the coordinates of the defects based on the transformation relationship.

29. The system of clause 28, wherein the controller has circuitry to select at least two defects as the subset of the defects.

30. The system of clause 28, wherein the controller including circuitry to set the FoV of the electron-beam inspection tool to a second size includes the controller including circuitry to:
  control the electron-beam inspection tool to locate a first defect, the first defect being different from the selected defects;
  determine a position of the first defect based on the inspection data;
  determine a difference between the determined position of the first defect and an adjusted coordinate of the first defect; and
  when the difference is equal to or below a predetermined threshold, change the FoV of the electron-beam inspection tool to the second size to locate additional defects based on the adjusted coordinates.

31. The system of clause 30, wherein the controller includes circuitry to:
  when the difference exceeds the predetermined threshold, update the transformation relationship based on the determined position of the first defect; and
  further adjust the coordinates of the defects based on the updated transformation relationship.

32. A controller coupled with an electron-beam inspection tool configured to scan a sample with a primary electron beam to generate inspection data, the controller comprising:
  a memory storing instructions; and
  a processor configured to execute the instructions to cause the controller to:
    acquire, via an optical imaging tool, coordinates of defects on the sample;
    set a Field of View (FoV) of the electron-beam inspection tool to a first size to locate a subset of the defects;
    determine a position of each defect of the subset of the defects based on inspection data generated by the electron-beam inspection tool during a scan of the sample;
    adjust the coordinates of the defects based on the determined positions of the subset of the defects; and
    set the FoV of the electron-beam inspection tool to a second size to locate additional defects based on the adjusted coordinates.

33. The controller of clause 32, wherein the electron-beam inspection tool being configured to scan the sample with the primary electron beam to generate the inspection data includes the electron-beam inspection tool being configured to scan the sample with a plurality of electron beams to generate the inspection data.

34. The controller of any one of clauses 32 and 33, wherein the first size is larger than the second size.

35. The controller of any one of clauses 32-34, wherein the sample is an un-patterned wafer.

36. The controller of any one of clauses 32-35, wherein the processor being configured to execute the instructions to cause the controller to adjust the coordinates of the defects based on the determined positions of the subset of the defects includes the processor being further configured to execute the instructions to cause the controller to:
  determine a transformation relationship for the coordinates of the detects based on the determined positions of the subset of the defects;
  map the coordinates acquired via the optical imaging tool to a new set of coordinates, based on the transformation relationship; and
  set the new set of coordinates as the adjusted coordinates.

37. The controller of any one of clauses 32-35, wherein the processor being configured to execute the instructions to cause the controller to adjust the coordinates of the defects based on the determined positions of the subset of the defects includes the processor being further configured to execute the instructions to cause the controller to:
  select a number of defects;
  control the electron-beam inspection tool to locate the selected detects;
  determine positions of the selected defects based on the inspection data;
  determine a transformation relationship for the coordinates of the detects based on the determined positions of the selected defects; and
  adjust the coordinates of the defects based on the transformation relationship.

38. The controller of clause 37, wherein the processor is further configured to execute the instructions to cause the controller to select at least two defects as the subset of the defects.

39. The controller of clause 37, wherein the processor being configured to execute the instructions to cause the controller set the FoV of the electron-beam inspection tool to a second size includes the processor being further configured to execute the instructions to cause the controller to:
  control the electron-beam inspection tool to locate a first defect, the first defect being different from the selected defects;
  determine a position of the first defect based on the inspection data;
  determine a difference between the determined position of the first defect and an adjusted coordinate of the first defect; and
  when the difference is equal to or below a predetermined threshold, change the FoV of the electron-beam inspection tool to the second size to locate additional defects based on the adjusted coordinates.

40. The controller of clause 39, wherein the processor is further configured to execute the instructions to cause the controller to:
  when the difference exceeds the predetermined threshold, update the transformation relationship based on the determined position of the first defect; and
  further adjust the coordinates of the defects based on the updated transformation relationship.

41. A computer-implemented method comprising:
  acquiring, via an optical imaging tool, coordinates of defects on a sample;
  setting a Field of View (FoV) of an electron-beam inspection tool to a first size to locate a subset of the defects;
  determining a position of each defect of the subset of the defects based on inspection data generated by the electron-beam inspection tool during a scan of the sample;
  adjusting the coordinates of the defects based on the determined positions of the subset of the defects; and
  setting the FoV of the electron-beam inspection tool to a second size to locate additional defects based on the adjusted coordinates.

42. The computer-implemented method of clause 41, wherein the first size is larger than the second size.
43. The computer-implemented method of any one of clauses 41 and 42, wherein the sample is an un-patterned wafer.
44. The computer-implemented method of any one of clauses 41-43, wherein setting a FoV of the electron-beam inspection tool to the first size to locate the subset of the defects includes:
   selecting a number of defects; and
   controlling the electron-beam inspection tool to locate the selected detects;
45. The computer-implemented method of clause 44, wherein adjusting the coordinates of the defects based on the determined positions of the subset of the defects includes:
   determining a transformation relationship for the coordinates of the detects based on the determined positions of the selected defects;
   mapping the coordinates of defects acquired via the optical imaging tool to a new set of coordinates, based on the transformation relationship; and
   setting the new set of coordinates as the adjusted defects.
46. The computer-implemented method of clause 44, wherein the number of the selected defects is two or more than two.
47. The computer-implemented method of clause 44, wherein adjusting the coordinates of the defects based on the determined positions of the subset of the defects further includes:
   controlling the electron-beam inspection tool to locate a first defect, the first defect being different from the selected defects;
   determining a position of the first defect based on the inspection data;
   determining a difference between the determined position of the first defect and an adjusted coordinate of the first defect; and
   when the difference is equal to or below a predetermined threshold, changing the FoV of the electron-beam inspection tool to the second size and controlling the electron-beam inspection tool to locate additional defects based on the adjusted coordinates.
48. The computer-implemented method of clause 47, wherein adjusting the coordinates of the defects based on the determined positions of the subset of the defects further includes:
   when the difference exceeds the predetermined threshold, updating the transformation relationship based on the determined position of the first defect; and
   further adjusting the coordinates of the defects based on the updated transformation relationship.
49. A non-transitory computer-readable medium storing a set of instructions that are executable by a processor of a device to cause the device to perform a method comprising:
   acquiring, via an optical imaging tool, coordinates of defects on a sample;
   setting a Field of View (FoV) of an electron-beam inspection tool to a first size to locate a subset of the defects;
   determining a position of each defect of the subset of the defects based on inspection data generated by the electron-beam inspection tool during a scan of the sample;
   adjusting the coordinates of the defects based on the determined positions of the subset of the defects; and
   setting the FoV of the electron-beam inspection tool to locate additional defects based on the adjusted coordinates.
50. The non-transitory computer-readable medium of clause 49, wherein the first size is larger than the second size.
51. The non-transitory computer-readable medium of any one of clauses 49 and 50, wherein the sample is an un-patterned wafer.
52. The non-transitory computer-readable medium of any one of clauses 49-51, wherein setting a FoV of the electron-beam inspection tool to the first size and controlling the electron-beam inspection tool to locate the subset of the defects includes:
   selecting a number of defects; and
   controlling the electron-beam inspection tool to locate the selected detects.
53. The non-transitory computer-readable medium of clause 52, wherein adjusting the coordinates of the defects based on the determined positions of the subset of the defects includes:
   determining a transformation relationship for the coordinates of the detects based on the determined positions of the selected defects;
   mapping the coordinates of defects acquired via the optical imaging tool to a new set of coordinates, based on the transformation relationship; and
   setting the new set of coordinates as the adjusted coordinates.
54. The non-transitory computer-readable medium of clause 52, wherein the number of the selected defects is two or more than two.
55. The non-transitory computer-readable medium of clause 52, wherein adjusting the coordinates of the defects based on the determined positions of the subset of the defects further includes:
   controlling the electron-beam inspection tool to locate a first defect, the first defect being different from the selected defects;
   determining a position of the first defect based on the inspection data;
   determining a difference between the determined position of the first defect and an adjusted coordinate of the first defect; and
   when the difference is equal to or below a predetermined threshold, changing the FoV of the electron-beam inspection tool to the second size to locate additional defects based on the adjusted coordinates.
56. The non-transitory computer-readable medium of clause 55, wherein adjusting the coordinates of the defects based on the determined positions of the subset of the defects further includes:
   when the difference exceeds the predetermined threshold, updating the transformation relationship based on the determined position of the first defect; and
further adjusting the coordinates of the defects based on the updated transformation relationship.
57. The defect review tool of clause 1, wherein the sample is a bare wafer.
58. The defect review tool of clause 57, wherein the bare wafer is an unpatterned wafer.

It will be appreciated that the present disclosure is not limited to the exact construction that has been described above and illustrated in the accompanying drawings, and that various modifications and changes can be made without departing from the scope thereof. It is intended that the scope of the invention should only be limited by the appended claims.

What is claimed is:

1. A system comprising:
an optical imaging tool including circuitry to illuminate a sample with light and detect light scattered from the sample;
an inspection tool including circuitry to generate inspection data associated with the sample; and
a controller in communication with the optical imaging tool and the inspection tool, the controller including circuitry to:
receive light-scattering data generated by the optical imaging tool;
determine coordinates of defects on the sample based on the light-scattering data;
set a Field of View (FoV) of the inspection tool to a first size to locate a subset of the defects;
determine a position of each defect of the subset of the defects based on inspection data generated by the inspection tool based on the sample;
adjust the coordinates of the defects based on the determined positions of the subset of the defects; and
set the FoV of the inspection tool to a second size to locate additional defects based on the adjusted coordinates.

2. The system of claim 1, wherein the inspection tool includes circuitry to scan the sample with multiple charged-particle beams.

3. The system of claim 1, further comprising:
a transport device including circuitry and an actuator to transport the sample from the optical imaging tool to the inspection tool.

4. The system of claim 1, wherein the first size is larger than the second size.

5. The system of claim 1, wherein the sample is an un-patterned wafer.

6. The system of claim 1, wherein the controller including circuitry to adjust the coordinates of the defects based on the determined positions of the subset of the defects includes the controller including circuitry to:
determine a transformation relationship for the coordinates of the defects based on the determined positions of the subset of the defects;
map the coordinates acquired via the optical imaging tool to a new set of coordinates, based on the transformation relationship; and
set the new set of coordinates as the adjusted coordinates.

7. The system of claim 1, wherein the controller including circuitry to adjust the coordinates of the defects based on the determined positions of the subset of the defects includes the controller including circuitry to:
select a number of defects;
control the inspection tool to locate the selected defects; determine positions of the selected defects based on the inspection data; determine a transformation relationship for the coordinates of the defects based on the determined positions of the selected defects; and
adjust the coordinates of the defects based on the transformation relationship.

8. The system of claim 7, wherein the controller has circuitry to select at least two defects as the subset of the defects.

9. The system of claim 7, wherein the controller including circuitry to set the FoV of the inspection tool to a second size includes the controller including circuitry to:
control the inspection tool to locate a first defect, the first defect being different from the selected defects;
determine a position of the first defect based on the inspection data;
determine a difference between the determined position of the first defect and an adjusted coordinate of the first defect; and
when the difference is equal to or below a predetermined threshold, change the FoV of the inspection tool to the second size to locate additional defects based on the adjusted coordinates.

10. The system of claim 9, wherein the controller includes circuitry to:
when the difference exceeds the predetermined threshold, update the transformation relationship based on the determined position of the first defect; and
further adjust the coordinates of the defects based on the updated transformation relationship.

11. A controller coupled with an optical imaging tool and an inspection tool, the optical imaging tool being configured to illuminate a sample with light and detect light scattered from the sample, the inspection tool being configured to generate inspection data associated with the sample, the controller comprising:
a memory storing instructions; and
a processor configured to execute the instructions to cause the controller to:
acquire, via the optical imaging tool, coordinates of defects on the sample;
set a Field of View (FoV) of the inspection tool to a first size to locate a subset of the defects;
determine a position of each defect of the subset of the defects based on the inspection data generated by the inspection tool during a scan of the sample;
adjust the coordinates of the defects based on the determined positions of the subset of the defects; and
set the FoV of the inspection tool to a second size to locate additional defects based on the adjusted coordinates.

12. The controller of claim 11, wherein the inspection tool being configured to generate the inspection data includes the inspection tool being configured to generate the inspection data with a plurality of electron beams.

13. The controller of claim 11, wherein the first size is larger than the second size.

14. The controller of claim 11, wherein the sample is an un-patterned wafer.

15. The controller of claim 11, wherein the processor being configured to execute the instructions to cause the controller to adjust the coordinates of the defects based on the determined positions of the subset of the defects includes the processor being further configured to execute the instructions to cause the controller to:
determine a transformation relationship for the coordinates of the defects based on the determined positions of the subset of the defects;
map the coordinates acquired via the optical imaging tool to a new set of coordinates, based on the transformation relationship; and
set the new set of coordinates as the adjusted coordinates.

16. The controller of claim 11, wherein the processor being configured to execute the instructions to cause the controller to adjust the coordinates of the defects based on the determined positions of the subset of the defects includes the processor being further configured to execute the instructions to cause the controller to:
select a number of defects;

control the inspection tool to locate the selected defects; determine positions of the selected defects based on the inspection data; determine a transformation relationship for the coordinates of the defects based on the determined positions of the selected defects; and adjust the coordinates of the defects based on the transformation relationship.

17. The controller of claim 16, wherein the processor is further configured to execute the instructions to cause the controller to select at least two defects as the subset of the defects.

18. The controller of claim 16, wherein the processor being configured to execute the instructions to cause the controller to set the FoV of the inspection tool to a second size includes the processor being further configured to execute the instructions to cause the controller to:

control the inspection tool to locate a first defect, the first defect being different from the selected defects;

determine a position of the first defect based on the inspection data;

determine a difference between the determined position of the first defect and an adjusted coordinate of the first defect; and when the difference is equal to or below a predetermined threshold, change the FoV of the electron-beam inspection tool to the second size to locate additional defects based on the adjusted coordinates.

19. The controller of claim 18, wherein the processor is further configured to execute the instructions to cause the controller to:

when the difference exceeds the predetermined threshold, update the transformation relationship based on the determined position of the first defect; and further adjust the coordinates of the defects based on the updated transformation relationship.

20. A computer-implemented method comprising:

acquiring, via an optical imaging tool, coordinates of defects on a sample;

setting a Field of View (FoV) of an inspection tool to a first size to locate a subset of the defects;

determining a position of each defect of the subset of the defects based on inspection data generated by the inspection tool during a scan of the sample;

adjusting the coordinates of the defects based on the determined positions of the subset of the defects; and setting the FoV of the inspection tool to a second size to locate additional defects based on the adjusted coordinates.

* * * * *